(12) United States Patent
Hsu et al.

(10) Patent No.: US 7,657,564 B2
(45) Date of Patent: Feb. 2, 2010

(54) METHOD FOR SELECTING A FERRITE BEAD FOR A FILTER

(75) Inventors: Shou-Kuo Hsu, Tu-cheng (TW); Chun-Jen Chen, Tu-cheng (TW); Chun-Shan Hsiao, Tu-cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 358 days.

(21) Appl. No.: 11/525,445

(22) Filed: Sep. 22, 2006

(65) Prior Publication Data

US 2007/0220050 A1 Sep. 20, 2007

(30) Foreign Application Priority Data

Mar. 17, 2006 (CN) .................... 2006 1 0034551

(51) Int. Cl.
*G06F 17/30* (2006.01)
(52) U.S. Cl. ...................... 707/104.1; 361/45
(58) Field of Classification Search .............. 707/104.1
See application file for complete search history.

(56) References Cited

U.S. PATENT DOCUMENTS 5,896,079 A 4/1999 Parker

| | | | |
|---|---|---|---|
| 6,837,732 B2 * | 1/2005 | Pavlovic et al. ............. 439/352 |
| 2001/0048298 A1 * | 12/2001 | Doshita et al. ........... 324/76.21 |
| 2004/0165368 A1 * | 8/2004 | Norte et al. ................. 361/816 |
| 2006/0033587 A1 * | 2/2006 | Cabanillas .............. 331/108 C |
| 2007/0001782 A1 * | 1/2007 | Sasaki et al. ................ 333/185 |

* cited by examiner

*Primary Examiner*—Neveen Abel Jalil
*Assistant Examiner*—Son T Hoang
(74) *Attorney, Agent, or Firm*—Wei Te Chung

(57) ABSTRACT

A method for selecting a ferrite bead for a filter to avoid a peak value in a frequency response curve of the filter is provided. The method includes the steps of: building an equivalent model database including parameters of equivalent models of ferrite beads, the parameters including an inductance and a capacitance of a corresponding equivalent model of each ferrite bead; calculating parameters of a desired ferrite bead in the filter based on parameters of the filter, the parameters of the ferrite bead including an inductance, a capacitance, and a resonant frequency; adjusting parameters of the filter until the calculated resonant frequency equals or approaches a desired resonant frequency, and finding an inductance and a capacitance respectively equaling or approaching the calculated inductance and the calculated capacitance in the database; and selecting a ferrite bead with the appropriate inductance and capacitance as found in the database for the filter.

8 Claims, 2 Drawing Sheets

METHOD FOR SELECTING A FERRITE BEAD FOR A FILTER

BACKGROUND OF THE INVENTION

1. Field of the Invention

The present invention relates to a method for selecting a ferrite bead for a filter.

2. Description of Related Art

Ferrite beads are widely used as attenuators or suppressors of unwanted signals in electrical circuits. A ferrite bead is inserted into a filter of a power supply circuit containing useful signals as well as electromagnetic interference (EMI). The desired signals will pass through the filter while the undesired EMI will be attenuated by the filter. This is accomplished through an impedance of the ferrite bead, which is frequency sensitive. Direct and low frequency currents see only the conductor, and are unimpeded. The high frequency energy couples with the ferrite bead and impedance is developed which has inductive and resistive components. When a line is passed through a ferrite core, low frequency energy is transmitted with little loss, whereas higher frequency energy encounters the inductive reactance caused by the real part of the complex permeability of the ferrite bead. The inductive reactance reduces the conducted EMI current and introduces an insertion loss.

However, the ferrite bead has a characteristic of resonance, which causes a peak value in a frequency response curve of the filter, which can lead to the filter oscillating, disabling the filter.

What is needed, therefore, is a method for selecting a ferrite bead for a filter, avoiding a peak value in a frequency response curve of the filter.

SUMMARY OF THE INVENTION

A method for selecting a ferrite bead from a plurality of ferrite beads for a filter to avoid a peak value in a frequency response curve of the filter is provided. In a preferred embodiment, the method includes the steps of: building an equivalent model database including parameters of equivalent models of the plurality of ferrite beads, the parameters including an inductance and a capacitance of a corresponding equivalent model of each ferrite bead; calculating parameters of a desired ferrite bead in the filter based on parameters of the filter, the parameters of the desired ferrite bead including an inductance, a capacitance and a resonant frequency; adjusting parameters of the filter until the calculated resonant frequency equals or approaches a desired resonant frequency, and finding an inductance and a capacitance respectively equaling or approaching the calculated inductance and the calculated capacitance in the database; and selecting a ferrite bead with the appropriate inductance and capacitance as found in the database for the filter.

Other advantages and novel features will become more apparent from the following detailed description when taken in conjunction with the accompanying drawings, in which:

DETAILED DESCRIPTION OF THE INVENTION

Figure 1:
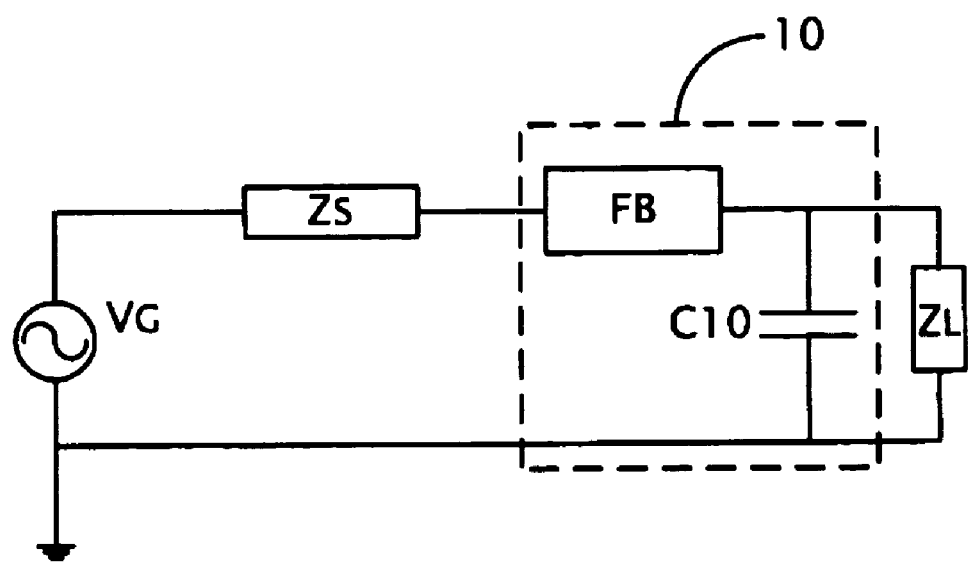
FIG. 1 is a circuit diagram of a power supply circuit with a ferrite bead, in accordance with a preferred embodiment of the present invention.

Referring to FIG. 1, a power supply circuit includes a power supply source $V_G$, a power supply impedance $Z_S$, a filter 10, and a load impedance $Z_L$. The filter 10 serves to suppress EMI and provide a filtered power supply to the load impedance $Z_L$. The filter 10 includes a capacitor C10 and a ferrite bead FB connected in series.

Figure 2:
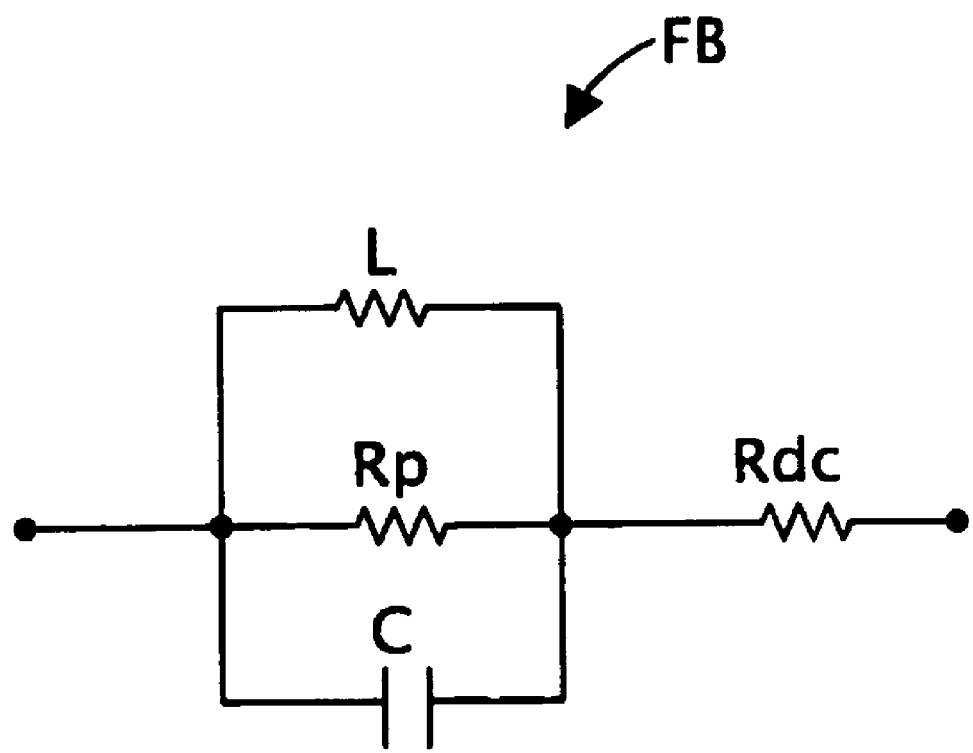
FIG. 2 is a circuit diagram showing an equivalent model of the ferrite bead of FIG. 1.

FIG. 2 shows an equivalent model of the ferrite bead FB. The equivalent model includes an inductance L, a capacitance C, a resistance RP having a resistance value equaling a peak value in an impedance curve of the ferrite bead FB, and a direct current resistance Rdc. The inductance L, the capacitance C, and the resistance RP are connected in parallel, and connected to the resistance Rdc in series. The inductance L is an inductive impedance of the ferrite bead FB when low frequency signals pass through the ferrite bead FB. The capacitance C is found using the following equation:

$$C = \frac{1}{4\pi^2 F^2 L}$$

Wherein F is a resonant frequency of the ferrite bead FB.

A method for selecting a ferrite bead FB for the filter 10 to avoid a peak value in a frequency response curve of the filter, in accordance with a preferred embodiment of the present invention includes the following steps.

Step 1: building equivalent models of all ferrite beads provided by manufacturers, and building an equivalent model database comprising parameters of the equivalent models, the parameters comprising an inductance and a capacitance of a corresponding equivalent model of each ferrite bead;

Step 2: calculating parameters of the ferrite bead FB based on parameters of the filter 10, the parameters of the filter 10 including a quality factor Q of the filter 10, a capacitance C of the capacitor C10, a load impedance $Z_L$ of the filter 10, and an attenuation constant A of the filter 10, the parameters of the ferrite bead FB including the inductance L and the capacitance C, the inductance L is found using the following equation:

$$L = \frac{R^2 C'}{Q^2}$$

The capacitance C is found using the following equation:

$$C = \frac{C'}{10^{-\frac{A}{20}} - 1}$$

The resonant frequency F is found using the following equation:

$$F = \frac{1}{2\pi\sqrt{LC}}$$

Step 3: comparing the resonant frequency F calculated in step 2 with a desired resonant frequency of the filter 10; if the resonant frequency F calculated in step 2 equals or approaches the desired resonant frequency, going to step 5; if the resonant frequency F calculated in step 2 does not equal or approach the desired resonant frequency, go to step 4;

Step 4: adjusting the quality factor Q and the attenuation constant A of the filter 10, then returning to step 2;

Step 5: searching the equivalent model database for an inductance L and a capacitance C respectively equaling or approaching the inductance L and the capacitance C calculated in step 2; if the inductance L and capacitance C do not exist in the equivalent model database, go to step 6; if the inductance L and capacitance C exist, go to step 7;

Step 6: adjusting the quality factor Q and the attenuation constant A of the filter 10, then returning to step 2;

Step 7: selecting a ferrite bead with the searched inductance L and capacitance C for the filter 10.

It is believed that the present invention and its advantages will be understood from the foregoing description, and it will be apparent that various changes may be made thereto without departing from the spirit and scope of the invention or sacrificing all of its material advantages, the example hereinbefore described merely being a preferred or exemplary embodiment.

What is claimed is:

1. A method for selecting a desired ferrite bead from a plurality of ferrite beads for a filter to avoid a peak value from occurring in a frequency response curve of the filter, the method comprising the steps of:

(a) building an equivalent model database comprising parameters of equivalent models of the plurality of ferrite beads, the parameters comprising an inductance and a capacitance of a corresponding equivalent model of each ferrite bead;

(b) calculating parameters of the desired ferrite bead in the filter based on parameters of the filter, the parameters of the desired ferrite bead comprising an inductance, a capacitance, and a resonant frequency, wherein the inductance of the desired ferrite bead in the filter is obtained as follows:

$$L = \frac{R^2 C'}{Q^2}$$

where L denotes the inductance of the desired ferrite bead, R denotes a load impedance of the filter, C' denotes a capacitance of the filter, and Q denotes a quality factor of the filter, wherein the capacitance of the desired ferrite bead in the filter is obtained as follows:

$$C = \frac{C'}{10^{-\frac{A}{20}} - 1}$$

where C denotes a capacitance of the desired ferrite bead, A denotes an attenuation constant of the filter, wherein the resonant frequency of the desired ferrite bead in the filter is obtained as follows:

$$F = \frac{1}{2\pi\sqrt{LC}}$$

where F denotes the resonant frequency of the desired ferrite bead;

(c) comparing the resonant frequency calculated in step (b) with a desired resonant frequency of the filter; if the resonant frequency calculated in step (b) equals or approaches the desired resonant frequency, going to step (e); if the resonant frequency calculated in step (b) does not equal or approach the desired resonant frequency, going to step (d);

(d) adjusting parameters of the filter, then returning to step (b) to obtain different parameters of the desired ferrite bead;

(e) searching the equivalent model database for an inductance and a capacitance respectively equaling or approaching the inductance and the capacitance calculated in step (b); if the inductance and capacitance do not exist in the database, going to step (f); if the inductance and capacitance exist, going to step (g);

(f) adjusting parameters of the filter, then returning to step (b) to obtain different parameters of the desired ferrite bead;

(g) selecting the desired ferrite bead with the searched inductance and capacitance in the database for the filter for avoiding the peak value in the frequency response curve of the filter.

2. The method as claimed in claim 1, wherein the inductance of each equivalent model is an impedance of the filter when low frequency signals pass through the filter.

3. The method as claimed in claim 1, wherein the parameters of each equivalent model further comprise a resistance having an impedance value equaling a peak value in an impedance curve of the ferrite bead, and a direct current resistance, the inductance, the capacitance, and the resistance are connected in parallel, and connected to the direct current resistance in series.

4. The method as claimed in claim 1, wherein the parameters of the filter comprise a quality factor of the filter, a capacitance of a filter capacitor, a load impedance of the filter, and an attenuation constant of the filter.

5. A computing system having at least one hardware processor, wherein said computing system is operable to implement a method for selecting a desired ferrite bead from a plurality of ferrite beads for a filter to avoid a peak value in a frequency response curve of the filter, the method comprising the steps of:

building an equivalent model database comprising parameters of equivalent models of the plurality of ferrite beads, the parameters comprising an inductance and a capacitance of a corresponding equivalent model of each ferrite bead;

calculating parameters of the desired ferrite bead in the filter based on parameters of the filter, the parameters of the desired ferrite bead comprising an inductance, a capacitance and a resonant frequency, wherein the inductance of the desired ferrite bead in the filter is obtained as follows:

$$L = \frac{R^2 C'}{Q^2}$$

where L denotes the inductance of the desired ferrite bead, R denotes a load impedance of the filter, C' denotes a capacitance of the filter, and Q denotes a quality factor of the filter, wherein the capacitance of the desired ferrite bead in the filter is obtained as follows:

$$C = \frac{C'}{10^{-\frac{A}{20}} - 1}$$

where C denotes a capacitance of the desired ferrite bead, A denotes an attenuation constant of the filter, wherein the resonant frequency of the desired ferrite bead in the filter is obtained as follows:

$$F = \frac{1}{2\pi\sqrt{LC}}$$

where F denotes the resonant frequency of the desired ferrite bead;

adjusting parameters of the filter until the calculated resonant frequency equals or approaches a desired resonant frequency, and finding an inductance and a capacitance respectively equaling or approaching the calculated inductance and the calculated capacitance in the database; and selecting the desired ferrite bead with the appropriate inductance and capacitance as found in the database for the filter for avoiding the peak value in the frequency response curve of the filter.

6. The computing system as claimed in claim 5, wherein the inductance of each equivalent model is an impedance of the filter when low frequency signals pass through the filter.

7. The computing system as claimed in claim 5, wherein the parameters of each equivalent model further comprise a resistance having an impedance value equaling a peak value in an impedance curve of the ferrite bead, and a direct current resistance, the inductance, the capacitance, and the resistance are connected in parallel, and connected to the resistance in series.

8. The computing system as claimed in claim 5, wherein the parameters of the filter comprise a quality factor of the filter, a capacitance of a filter capacitor, a load impedance of the filter, and an attenuation constant of the filter.

* * * * *

UNITED STATES PATENT AND TRADEMARK OFFICE
CERTIFICATE OF CORRECTION

| | | |
|---|---|---|
| PATENT NO. | : 7,657,564 B2 | Page 1 of 1 |
| APPLICATION NO. | : 11/525445 | |
| DATED | : February 2, 2010 | |
| INVENTOR(S) | : Hsu et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 491 days.

Signed and Sealed this

Thirtieth Day of November, 2010

David J. Kappos
*Director of the United States Patent and Trademark Office*